(12) United States Patent
Cate et al.

(10) Patent No.: US 9,324,557 B2
(45) Date of Patent: Apr. 26, 2016

(54) METHOD FOR FABRICATING EQUAL HEIGHT METAL PILLARS OF DIFFERENT DIAMETERS

(71) Applicant: LSI Corporation, San Jose, CA (US)

(72) Inventors: Steven D. Cate, Los Altos, CA (US); John W. Osenbach, Kutztown, PA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 42 days.

(21) Appl. No.: 14/259,530

(22) Filed: Apr. 23, 2014

(65) Prior Publication Data

US 2015/0262950 A1    Sep. 17, 2015

Related U.S. Application Data

(60) Provisional application No. 61/952,963, filed on Mar. 14, 2014.

(51) Int. Cl.
*H01L 23/48* (2006.01)
*H01L 23/52* (2006.01)
*H01L 29/40* (2006.01)
(Continued)

(52) U.S. Cl.
CPC .............. *H01L 21/00* (2013.01); *H01L 21/563* (2013.01); *H01L 21/565* (2013.01); *H01L 21/78* (2013.01); *H01L 24/11* (2013.01); *H01L 24/17* (2013.01); *H01L 24/81* (2013.01); *H01L 2224/118* (2013.01); *H01L 2224/11462* (2013.01); *H01L 2224/11622* (2013.01); *H01L 2224/13147* (2013.01); *H01L 2224/16113* (2013.01); *H01L 2224/16225* (2013.01); *H01L 2924/01022* (2013.01); *H01L 2924/01029* (2013.01); *H01L 2924/2076* (2013.01); *H01L 2924/20752* (2013.01); *H01L 2924/20753* (2013.01); *H01L 2924/20754* (2013.01); *H01L 2924/20755* (2013.01); *H01L 2924/20756* (2013.01); *H01L 2924/20757* (2013.01);
(Continued)

(58) Field of Classification Search
USPC ................... 257/772, 779, E23.015, E23.02, 257/E23.023–E23.079; 438/612–617
See application file for complete search history.

(56) References Cited

U.S. PATENT DOCUMENTS 5,541,135 A    7/1996    Pfeifer et al.
7,087,458 B2   8/2006    Wang et al.
(Continued)

OTHER PUBLICATIONS

Shinkawa Ltd.; Flip Chip Technology for TSV & Copper Pillar Process.
(Continued)

*Primary Examiner* — Dao H Nguyen
*Assistant Examiner* — Tram H Nguyen

(57) ABSTRACT

A process to form metal pillars on a flip-chip device. The pillars, along with a layer of solder, will be used to bond die pads on the device to respective substrate pads on a substrate. A photoresist is deposited over the device and a first set of die pads on the device are exposed by forming openings of a first diameter in the photoresist. Pillars of the first diameter are formed by electroplating metal onto the exposed die pads. Then a second photoresist deposited over the first photoresist covers the pillars of the first diameter. Openings of a second diameter are formed in the first and second photoresists to expose a second set of die pads. Pillars of the second diameter are formed by electroplating metal onto the exposed die pads. The photoresists are then removed along with conductive layers on the device used as part of the plating process.

22 Claims, 4 Drawing Sheets

(51) Int. Cl.
  *H01L 21/00* (2006.01)
  *H01L 21/56* (2006.01)
  *H01L 21/78* (2006.01)
  *H01L 23/00* (2006.01)

(52) U.S. Cl.
  CPC ........... *H01L 2924/20758* (2013.01); *H01L 2924/20759* (2013.01); *H01L 2924/37* (2013.01)

(56) References Cited

U.S. PATENT DOCUMENTS

| | | | |
|---|---|---|---|
| 7,952,206 | B2 | 5/2011 | Bachman et al. |
| 8,508,054 | B2 | 8/2013 | Pang et al. |
| 2005/0253264 | A1* | 11/2005 | Aiba ............ H01L 23/3114 257/738 |
| 2007/0184579 | A1 | 8/2007 | Huang et al. |
| 2012/0267779 | A1* | 10/2012 | Lin ............ H01L 23/49838 257/737 |
| 2013/0026621 | A1 | 1/2013 | Tsai et al. |

OTHER PUBLICATIONS

Deborah S. Patterson; Transforming Mobile Electronics with Copper Pillar Interconnect; Advancing Microelectronics; May/Jun. 2012, vol. 39, No. 3.

Lee et al.; Study of Interconnection Process for Fine Pitch Flip Chip; 2009 Electronic Components and Technology Conference.

Tyler N. Osborn; All-Copper Chip-To-Substrate Interconnects for High Performance Integrated Circuit Devices; A Dissertation Presented to The Academic Faculty; Georgia Institute of Technology May 2009.

Tung et al.; Sub-Micron-Accuracy Gold-to-Gold Interconnection Flip-Chip Bonding Approach for Electronics—Optics Heterogeneous Integration; Japanese Journal of Applied Physics 52 (2013) 04CB08; The Japan Society of Applied Physics.

Hou-Jun Hsu et al; A Novel Process for Fabricating Ultra-High Coplanarity in Electroplating Lead-Free Copper Pillar Bump; Institute of Mechanical and Electrical Engineering, National Taipei University of Technology, Taiwan 1, Sec.3, Chung Hsiao E. Rd, Taipei 106, Taiwan.

E Kukharenka et al.; Electroplating moulds using dry film thick negative photoresist; Institute of Physics Publishing; Journal of Micromechanics and Microengineering; J. Micromech. Microeng. 13 (2003) S67-S74; PII: S0960-1317(03)59956-9; Received Feb. 25, 2003, in final form Apr. 17, 2003; Published Jun. 13, 2003; Online at stacks.iop.org/JMM/13/S67.

Ate He et al.; Fabrication of Compliant, Copper-Based Chip-to-Substrate Connections; School of Chemical and Biomolecular Engineering, Georgia Institute of Technology, 311 Ferst Drive, Atlanta, GA 30332-0100; Email: ate.he@chbe.gatech.edu; 2006 Electronic Components and Technology Conference.

Hyun-Cheol Bae; Fine-Pitch Solder on Pad Process for Microbump Interconnection; ETRI Journal, vol. 35, No. 6, Dec. 2013; http://dx.doi.org/10.4218/etrij.13.0213.0284.

John H. Lau; Low Cost Flip Chip Technologies for DCA, WLCSP, and PBGA Assemblies; McGraw-Hill Companies; 2000.

\* cited by examiner

US 9,324,557 B2

METHOD FOR FABRICATING EQUAL HEIGHT METAL PILLARS OF DIFFERENT DIAMETERS

CROSS-REFERENCE TO RELATED APPLICATIONS

This application claims the benefit of the filing date of U.S. provisional patent application No. 61/952,963 filed 14 Mar. 2014, the teachings of which are incorporated herein by reference, and the subject matter of this application is related to U.S. patent application Ser. No. 14/259,432, titled "Method for Fabricating Equal Height Metal Pillars of Different Diameters", the teachings of which are incorporated herein by reference.

BACKGROUND OF THE INVENTION

1. Field of the Invention

The present invention relates to semiconductor packaging technology generally and, more specifically, to a process for forming metal pillars and a solder layers on semiconductor devices for flip-chip bonding to a substrate.

2. Description of the Related Art

Copper pillars are a widely used technique for electrically interconnecting a flip-chip semiconductor device or "chip" to conductors on an organic-based substrate, such as a thin (less than one millimeter thick) glass-epoxy board, because copper pillar interconnects have superior geometric control, higher density, and electrical performance relative to solder bump interconnects. The copper pillars on the device's die pads, formed by selectively plating copper onto the die pads, connect to the substrate's substrate pads by using a solder layer between each pillar and the respective substrate pad to join the copper pillars to the substrate pads. Plating is usually used to form the solder layer onto the ends of the copper pillars.

To bond a flip-chip device to a substrate, the device and substrate are brought together and heated until the solder on the ends of the copper pillars melts and wets the substrate pads on the substrate, each pillar and solder combination forming a "joint". Then the device-substrate combination is cooled down and the solder solidifies to bond the device to the substrate, forming a bonded device-substrate structure or "package".

In order to insure all substrate-to-die joints are formed during bonding, all of the copper pillars and solder layers on the die before heating are to have the same nominal height. In addition it is generally desirable for all of the joints to have substantially the same diameter. However, having joints with the same diameter might not be desirable in all instances. For example, for carrying a large number of high-speed signals between the chip and the substrate, it might be desirable to use thinner than "normal" diameter joints spaced to provide a high density of signal paths while at the same time providing a desired transmission line characteristic impedance between the joints, e.g., 50 or 100Ω. In other instances where a large current is to be carried by a joint, e.g., a power supply connection, electromigration might with time cause failure of a joint with a normal diameter. To address the high current problem, multiple joints with a normal diameter are placed in parallel or one or more of the joints are formed with a larger or wider diameter than a "normal" joint so that the current density in each joint is less than a maximum amount that would otherwise cause the joint to fail from electromigration. However, using a conventional plating process to make joints with different diameters with substantially uniform height has been problematic. For a given electrochemical plating process and plating bath solution, the mass or volume per unit of time of the plated material is essentially a constant except for any local variations in the bath current density or concentration of all of the plating species in a particular plating bath. As a result, using a conventional electroplating process to form different diameter joints will result in a device with smaller diameter joints that are taller than adjacent larger diameter joints. The uneven joint height might not allow the shorter joints on the device to be completely attached, if at all, to their respective substrate pads, while all of the taller joints will be completely attached, thus causing the completed package to be inoperable or prone to high rates of failure in the field. Further, any warpage of the substrate might exacerbate this situation, possibly increasing the number of partial or incomplete joints.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Described embodiments include a method for fabricating equal height metal pillars of different diameters on a wafer having a plurality of flip-chip devices, each flip-chip device having a plurality of die pads thereon. A first layer of photoresist is deposited on the wafer and the first layer of photoresist is patterned to form a plurality of openings therein, the openings having a first diameter and exposing a first set of die pads. A first metal is plated into the openings of the first diameter to form a first plurality of metal pillars therein, each of the first plurality of metal pillars having substantially the first diameter and a first height above its respective die pad. A second layer of photoresist is deposited on the wafer, the second photoresist layer covering at least the metal pillars of the first diameter, and the first layer of photoresist is patterned to form a plurality of openings therein, the openings having a second diameter and exposing a second set of die pads. A second metal is plated into the openings of the second diameter to form a second plurality of metal pillars therein, each of the second plurality of metal pillars having substantially the second diameter and a second height above its respective die pad. The first diameter is different from the second diameter, the first and second heights being approximately the same, and the first set of die pads is different from the second set of die pads.

BRIEF DESCRIPTION OF THE DRAWINGS

Other embodiments of the present invention will become more fully apparent from the following detailed description, the appended claims, and the accompanying drawings in which like reference numerals identify similar or identical elements. The drawings are not to scale.

DETAILED DESCRIPTION

Figure 1:
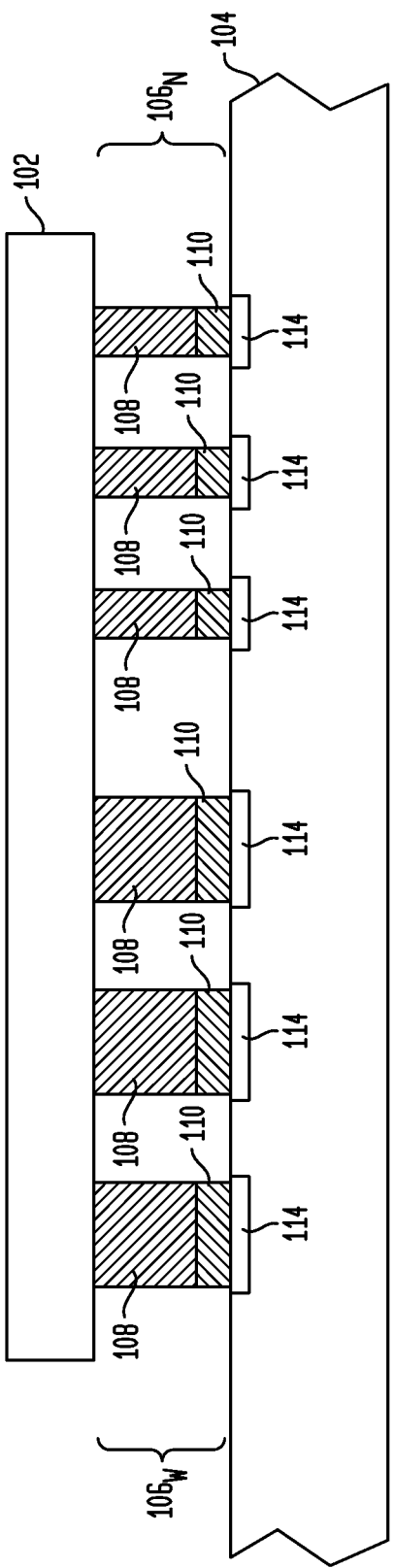
FIG. 1 is a cross-section of a flip-chip device bonded to a substrate using copper pillars and solder of different diameters in one embodiment of the invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation".

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

The term "or" should be interpreted as inclusive unless stated otherwise. Further, elements in a figure having subscripted reference numbers, e.g., $100_1$, $100_2$, . . . $100_K$, or $100_A$, $100_B$, etc. might be collectively referred to herein using a single reference number, e.g., 100.

It should be understood that the steps of the exemplary methods set forth herein are not necessarily required to be performed in the order described, and the order of the steps of such methods should be understood to be merely exemplary. Likewise, additional steps might be included in such methods, and certain steps might be omitted or combined, in methods consistent with various embodiments of the present invention.

Also for purposes of this description, the terms "couple", "coupling", "coupled", "connect", "connecting", or "connected" refer to any manner known in the art or later developed in which energy is allowed to be transferred between two or more elements, and the interposition of one or more additional elements is contemplated, although not required. Conversely, the terms "directly coupled", "directly connected", etc., imply the absence of such additional elements.

The present invention will be described herein in the context of illustrative embodiments of a process to form metal pillars on a flip-chip device that will be bonded to a substrate by joining die pads on the flip-chip device to substrate pads on the substrate using joints of metallic pillars, such as copper pillars, and solder. The pillars and the solder on them are formed by electroplating a metal onto the die pads. According to Faraday's Law, the total amount of metal deposited on a workpiece by electroplating is proportional to the current passed through the workpiece in an electroplating bath the device is immersed in, and the amount of time the current is applied, i.e., the amount of charge (in coulombs) applied to the workpiece. However, the rate at which each pillar is formed is inversely proportional to the surface area of the pillar. Thus, the wider pillars grow more slowly than narrow pillars. To form narrow and wide pillars having approximately the same height, the wide pillars are formed separately from the narrow pillars by using two photoresist layers. A first photoresist layer has openings of a first diameter in which pillars of the first diameter are formed by plating metal into the openings and onto exposed die pads. A second photoresist layer deposited over the first photoresist layer covers the pillars of the first diameter and has openings of a second diameter in the first and second photoresist layers. Pillars of the second diameter are formed by plating metal into the openings and onto exposed die pads. The photoresist layers are then removed along with any conductive layers between the die pads used as part of the plating process. By knowing the first and second diameters and controlling the plating current and time, the height the pillars with the second diameter are formed to approximately the same height as the pillars with the first diameter. As described below, the solder layers might also be formed by plating solder into the openings and in conjunction with the formation of the pillars.

FIG. 1 is a cross-section of a flip-chip device 102 bonded to a substrate 104 to form a flip-chip package 100 in accordance with an embodiment of the invention. Die pads (not shown) on the device 102 are bonded to substrate pads 114 on the substrate 104 using multiple conductors or joints 106. The device 102 might be formed from silicon, gallium arsenide, indium phosphide, or another semiconductor material suitable for the desired function of the device 102. The substrate 104 might be formed from a glass-epoxy (commonly known as FR-4), polytetrafluoroethylene (PTFE), polyimide, ceramics, silicon, glass, another insulating material suitable as a substrate, or a combination of these materials. Typically, the thickness of the substrate 104 is less than two millimeters and might be as thin as 50 microns (μm). The lateral dimensions of the substrate 104 are typically larger than that of the device 102.

In this example, the joints 106 are arranged with narrow joints $106_N$ on the right side of the package 100 and wide joints $106_W$ at the left side of the package 100. Generally, power and ground are supplied to the device 100 using the wide joints $106_W$ on the left side of the device 102 and high-speed signals are carried by the narrow joints $106_N$ on the right side of the device 102. It is understood that in various instances, the wide joints carry the high-speed signals and the narrow joints supply power and ground to the device 102. Further, the positions of the wide and narrow joints are greatly simplified for illustrative purposes; typically hundreds of joints are present and power/ground interconnections are generally made in the center of the device 102 while high-speed signals are generally carried by joints near the periphery of the device 102.

Each joint is formed from a metallic pillar 108, such as copper, and a layer of solder 110. For the proper bonding of all the joints between the device 102 and substrate 104, the height of all of the pillars 108 and solder layers 110 prior to bonding should be of uniform height, otherwise when the device 102 is bonded to substrate 104, a gap between some of the solder layers 110 and the respective substrate pad 114 might be so large that during reflow when the device and substrate are heated sufficiently for the solder to melt, balling-up by the solder on the end of the pillar (caused by surface tension of the molten solder) is insufficient to bridge the gap so that the solder does not wet the substrate pad and no electrical/mechanical joint is made.

Figure 2:
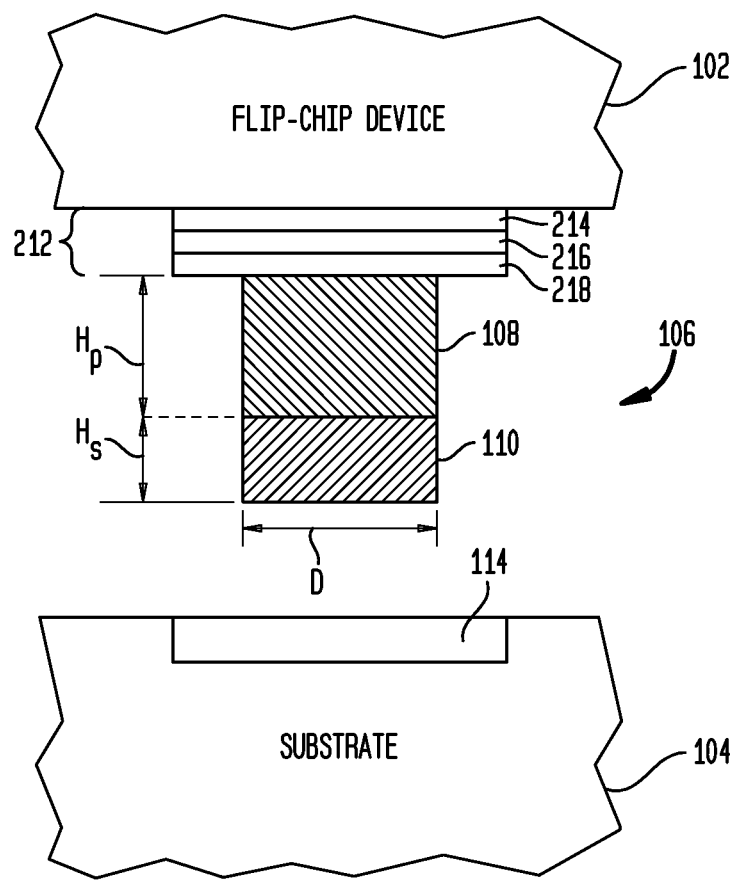
FIG. 2 is a cross-section of one pillar and solder layer of FIG. 1 prior to bonding.

Referring to FIG. 2, one of the joints 106 in FIG. 1 is shown as the joint appears prior to bonding the device 102 to the substrate 104. As discussed above, a joint 106 is formed from a copper pillar 108 and a layer of solder 110. The copper pillar is formed on a die pad 212 that has, in this embodiment, three layers. A contact layer 214 is typically in or on the surface of the device 102, is made of copper or aluminum, and connects to circuitry (not shown) within the device 102. Over the contact layer 214 is a layer 216 of titanium or titanium-tungsten that operates as a barrier/glue layer. Next, a strike layer 218, typically of the same metal as used to form the pillar 108 (e.g., copper). As will be explained in more detail below, the layers 216 and 218 are sputtered onto the device 102 and are typically less than 100 nm thick. Not shown are one or more conventional passivation layers (e.g., silicon nitride or alternating layers of silicon nitride and silicon dioxide) on the surface of the device 102 that has openings therein to expose the layer 214 and serves to protect the device from contaminants and physical damage.

On substrate 104 is a respective one of the substrate pads 114, also typically made of copper, shown aligned with the die pad 212. The substrate copper pad might be coated with another metal such as tin, silver, a nickel-gold eutectic, or solder.

The copper pillar 108 has a height of $H_P$ and the solder layer 110 has a height of $H_S$ (before melting), and both have an approximate diameter D. The height of the joint is $H_P+H_S$ so that the total height of the pillar and solder is H. In various embodiments, the height of the joint prior to melting ranges from 5 μm to 130 μm. In one embodiment, the copper pillars have a diameter ranging from approximately 20 μm to approximately 80 μm, a height $H_P$ of 20-70 μm, and the solder layers, prior to melting, have a height $H_S$ of 10-60 μm so that the total height is approximately 80 μm and might range from 5 μm to 130 μm. However, it is understood that the ratio of the height of the copper pillar to the height of the solder layer before melting can range from 1:10 to 100:1 and the pillar diameter can range from 5-150 μm.

Assuming a possible pillar diameter accuracy of +/-1 μm for openings less than 10 μm, +/-2 μm for openings less than 30 μm, +/-5 for openings less than 50 μm, and +/-7 μm for openings less than 100 μm, and +/-8 μm for openings less than 150 μm, then for the following exemplary ranges in opening diameters, it might be desirable to perform the two separate pillar plating steps in accordance with the disclosed embodiments when the exemplary percentage difference between the narrow and wide openings is at least that in the following table:

| Both opening diameters | Minimum % diameter two separate plating steps |
| --- | --- |
| <60 | 10 |
| 60 < dia. < 100 | 7 |
| 100 < dia. < 150 | 5 |

However, it is understood that while the above percentage differences and ranges in opening diameters are merely exemplary, two separate plating steps might still be used where the percentage difference between the narrow and wide openings is less than the above-described amounts.

Figure 3:
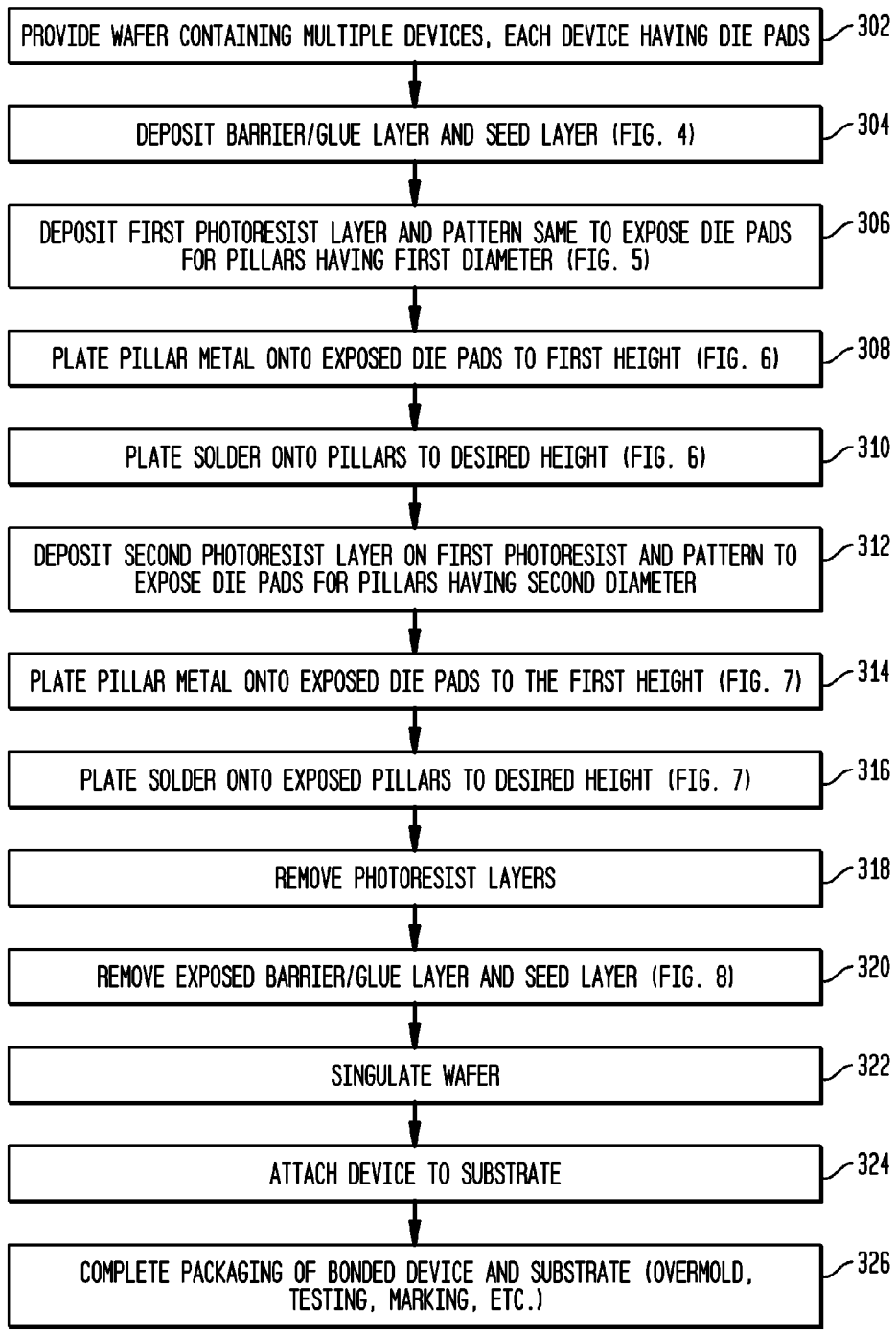
FIG. 3 a flowchart illustrating an exemplary process for forming metal pillars of different diameters and uniform height on a flip-chip device and then bonding the device to a substrate according to one embodiment of the invention.

FIG. 3 is a flowchart illustrating an exemplary process 300 for forming the pillars 108 and the solder layer 110 onto device 102 according to one embodiment of the invention. Beginning with step 302, a wafer containing multiple devices 102 is provided, each device having contact layers 214 thereon. For simplicity and because of the scale of a joint compared to that of a wafer, the process 300 is described below in the context of a single flip-chip device 102 but in practice the process steps are done at a wafer level because a wafer (not shown) comprises multiple flip-chip devices and all of the devices in the wafer are processed at the same time. It is not until an individual device is attached to a substrate (step 324) that the described steps are applied to a device individually.

Figure 4:
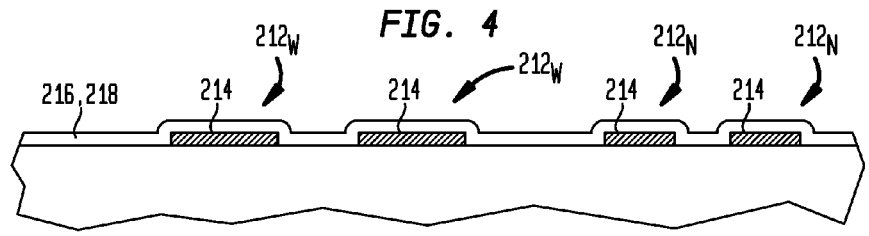
FIGS. 4-8 are diagrams illustrating the various steps in the process described in connection with FIG. 3.

Next, in step 304, the barrier/glue layer 216 and the strike layer 218 are deposited over the device 102. These two steps are illustrated in FIG. 4. Here, a partial cross-sectional view of the device 102 of FIG. 1 is shown but with just four contact layers 214, the two on the left being wider than the two on the right. Over the contact layer 214 are two layers 216 and 218, shown here for simplicity as one layer. As discussed above, these layers are each about 100 nm thick and are sputtered onto the device 102 although other techniques might be used to deposit the layers 216, 218, such as by evaporation. Because the barrier layer and the strike layers are conductive, the combined layers 216, 218 also serve as an electrode when the pillars and solder layer are later deposited by electroplating. While the die pad 212 in FIG. 2 is shown having three separate and laterally defined layers, for purposes of describing the embodiment in FIGS. 4-8, a contact layer 214, along with the metal layers immediately above the contact layer, are referred to herein as either a wide die pad $212_W$ or a narrow die pad $212_N$ as illustrated in FIG. 4. The widths of the contact layers 214 and die pads 212 are illustrative (e.g., wider pillars on wider die pads $212_W$ and narrow pillars on narrow die pads $212_N$) and all of the die pads might be the same size or have different sizes. However, the size of a die pad 212 should be at least as wide as the pillar formed thereon.

Figure 5:
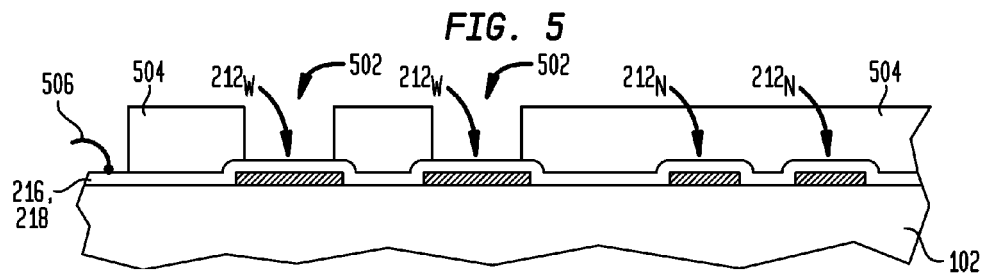

Returning to FIG. 3, in step 306 a first photoresist layer is deposited across the device 102 and is photolithigraphically patterned using conventional techniques to form openings having a first diameter in the photoresist over the wider die pads. This is shown in FIG. 5 where openings 502 are shown in photoresist 504 over the wide die pads $212_W$ and the narrow die pads $212_N$ remain covered by the photoresist 504. The width of the later-formed pillars will be approximately equal to the width of the openings 502. Part of the photoresist 504 is also removed to expose the conductive layers 216, 218 and an electrode 506 is shown contacting the conductive layers 216, 218 to provide a current path needed for electroplating. This electrode is not needed if the pillars and solder layer are formed using electroless plating.

Figure 6:
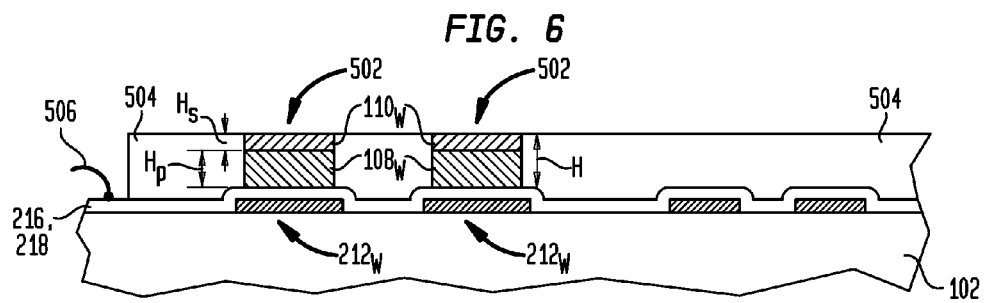

In step 308 of FIG. 3, the pillars $108_W$ are formed by plating metal onto the exposed portions of layer 216, 218 of the die pads $212_W$. Generally, this is accomplished by submersing the device 102 in a plating path (not shown) containing an aqueous solution of the metal being plated, e.g., copper sulfate, copper cyanide, nickel sulfate, etc. and electroplating the metal into the openings and onto the exposed die pads by applying current to the electrode 506 for an amount of time that will result in the deposition of the metal to the desired height, here $H_P$ (FIG. 2). Then the device 102 is removed from the plating bath, cleaned, and placed in another plating bath (not shown) containing the solder to be plated, e.g., stannous tin and lead sulfate, stannous tin and silver nitrate, etc., to deposit the solder layer $110_W$ in step 310. The result is shown in FIG. 6 where the wide pillars $108_W$ and solder layers $110_W$ are formed in the openings 502. The height of the pillar $108_W$ is shown as $H_P$, the height of the solder layer $110_W$ is shown as $H_S$, and the total height of the pillar and solder layer is height H. The top of the photoresist 504 is shown coincident with the total height H of the pillar and solder layer but the height H might be below the top of the photoresist 504.

As stated above, the height of the pillars and the solder layer is proportional to the plating current and time used to form them. Knowing the diameter of the opening 502 allows the relatively precise control of the height of the pillars and solder layer during formation with an accuracy of approximately 10% or better.

Figure 7:
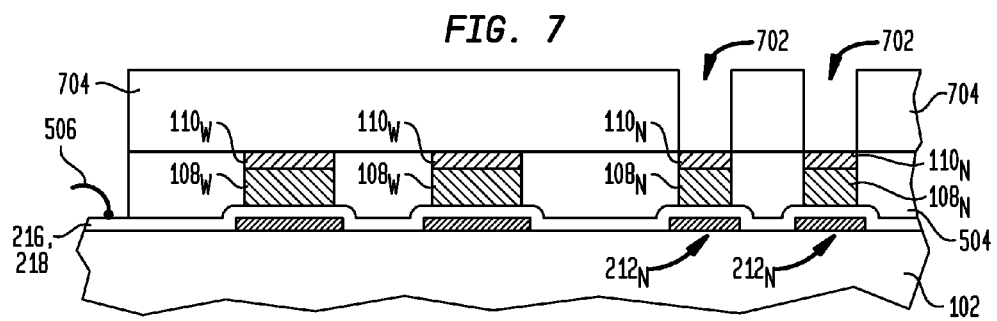

In step 312, a second photoresist layer deposited over the first photoresist layer, and the second photoresist layer is photolithigraphically patterned using conventional techniques to form openings having a second diameter, the second diameter being different from the diameter of the openings in the first photoresist layer. Then the openings in the second photoresist layer are used as a mask to form an opening with approximately the second diameter in the first photoresist layer to expose die pads. The openings in the first photoresist layer are formed by, for example, a conventional plasma etch or a conventional liquid chemical etch that selectively removes the patterned photoresist. The second photoresist layer covers up the already formed pillars and solder layers while die pads to have pillars formed thereon are exposed. This is illustrated in FIG. 7 where the second photoresist layer 704 is shown over the first photoresist layer 504 and covering the pillars 108$_W$ and solder layers 110$_W$. Openings 702 in the first and second photoresist layers 504, 704 have a narrow diameter and expose the narrow die pads 212$_N$.

In an alternative embodiment, the second photoresist layer 704 after patterning covers at least the pillars 108$_W$ and solder layers 110$_W$ but not the portion of the first photoresist layer 504 that covers the narrow die pads 212$_N$. In this embodiment, just the first photoresist layer 504 is patterned to form the openings 702.

Next, in steps 314 and 316, pillars and solder layers are formed in the openings of the second width so that the resulting pillars and solder layers will have a diameter approximately equal to the second width. This is illustrated in FIG. 7 where pillars 108$_N$ and solder layers 110$_N$ are plated into openings 702 and onto die pads 212$_N$. As with the forming of pillars 108$_W$ and solder layers 110$_W$, the pillars are formed in step 314 by submersing the device 102 in a plating path (not shown) containing an aqueous solution of the metal being plated and electroplating the metal into the openings and onto the exposed die pads by applying current to the electrode 506 for an amount of time that will result in the deposition of the metal to the desired height, here H$_P$ (FIG. 2). Then the device 102 is removed from the plating bath, cleaned, and placed in another plating bath (not shown) in step 316 to deposit the solder layer 101$_W$ to height H$_S$.

As with steps 308 and 310, the height of the pillars 108$_W$ and the solder layer 110$_W$ is proportional to the plating current and time used to form them. Knowing the ratio of the diameter of the opening 502 to that of opening 702 allows the height of the pillars and solder layers 108$_N$, 110$_N$ to be matched to that of pillars and solder layers 108$_W$, 110$_W$. For example, if the diameter of opening 502 is twice the diameter of the opening 702, then to form pillars 108$_N$ having the same height as pillars 108$_W$, then the product of the current applied to electrode 506 and the time spent plating (i.e., the amount of charge applied) is reduced by a factor of four. Similarly, the product of the current applied to electrode 506 and the time spent plating (i.e., the amount of charge applied) is reduced by a factor of four for plating the solder layers 110$_N$ in comparison to that used to plate solder layers 110$_W$.

Figure 8:
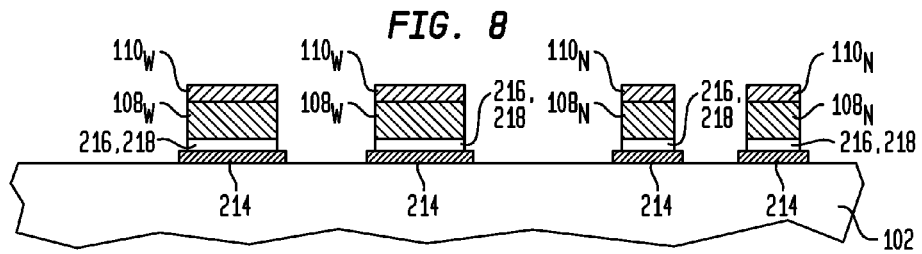

Next, in step 318 the photoresist layers 504, 704 are removed by ashing using an oxygen plasma or by dipping the device 102 into a chemical stripping bath. Then the conductive layer 216, 218 exposed by the removed photoresist is removed in step 320 by plasma etching or by wet etching. The result is shown in FIG. 8 where two sets of joints are shown, a two wide joints 106$_W$ and two narrow joints 106$_N$, each having substantially the same height above the device 102.

In step 322, the wafer (not shown) is singulated into multiple devices 102. Then in step 324, each flip-chip device is bonded to a substrate using a conventional flip-chip bonding technique to form the package 100 shown in FIG. 1. Briefly and for example, the package 100 is formed by bringing the flip-chip device 102 into proximity to the substrate such that the substrate pads 114 are aligned with respective metal pillars 108 on the flip-chip device. Then the metal pillars are then bonded to their respective substrate pads by melting the solder layers 110 so that the solder wets both the pillars and the substrate pads and then the device and substrate are cooled to solidify the solder.

Next, in step 326, the final steps to complete the packaging of the bonded device and substrate are done, such as forming an underfill layer between the device and the substrate, adding a heat spreader lid, forming an overmold of epoxy to the device and substrate for environmental protection, testing, package marking, etc.

In an alternative embodiment, instead of applying the solder to the ends of the copper pillars, a layer of solder is deposited on each of the substrate pads 114 by using a patterned solder mask (not shown) on the substrate 104 with the substrate pads exposed and the solder plated onto the exposed pads, using either conventional electroplating or electroless plating. In this example, the solder layers 110 are not formed and steps 310 and 316 are not performed.

While the embodiments described above entail the formation of wide pillars before narrow pillars, the narrow pillars can be formed before the wide pillars. Further, three or more different pillar widths might be formed on a device using the concepts described above. Still further, pillars of different metals, such as copper for a first set of pillars and nickel for a second set, can done with the above-described process.

Although the elements in the following method claims are recited in a particular sequence with corresponding labeling, unless the claim recitations otherwise imply a particular sequence for implementing some or all of those elements, those elements are not necessarily intended to be limited to being implemented in that particular sequence.

It is understood that various changes in the details, materials, and arrangements of the parts which have been described and illustrated in order to explain the nature of this invention might be made by those skilled in the art without departing from the scope of the invention as expressed in the following claims.

The invention claimed is:

1. A package comprising:
   a flip-chip device having die pads thereon;
   a substrate having substrate pads thereon that are aligned with respective die pads;
   a first plurality of metal pillars having a first diameter disposed between a first plurality of the die pads and a first plurality of the substrate pads;
   a second plurality of metal pillars having a second diameter disposed between a second plurality of the die pads and a second plurality of the substrate pads; and
   a third plurality of metal pillars having a third diameter disposed between a third plurality of the die pads and a third plurality of the substrate pads;
   wherein the second diameter is greater than the first diameter, the third diameter is greater than the second diameter, all of the of metal pillars have substantially the same height, and the metal pillars are formed by electroplating metal onto the die pads.

2. The package of claim 1 wherein the metal is copper.

3. The package of claim 1 wherein each die pad of the first plurality of die pads includes at least one of a first contact layer, a first barrier layer, and a first strike layer.

4. The package of claim 3 wherein each die pad of the second plurality of die pads includes at least one of a contact layer, a barrier layer, and a strike layer.

5. The package of claim 1 wherein each die pad of the first plurality of die pads includes a first contact layer, a first barrier layer, and a first strike layer, wherein the first contact layer is positioned between the flip-chip device and the first barrier layer, wherein the first barrier layer is positioned between the first contact layer and the first strike layer, wherein the first strike layer is positioned between the first barrier layer and one of the first plurality of metal pillars, and wherein each of the first contact layer, the first barrier layer, and the first strike layer have a diameter at least as large as the first diameter of the one of the first plurality of metal pillars.

6. The package of claim 5 wherein each die pad of the second plurality of die pads includes a second contact layer, a second barrier layer, and a second strike layer, wherein the second contact layer is positioned between the flip-chip device and the second barrier layer, wherein the second barrier layer is positioned between the second contact layer and the second strike layer, wherein the second strike layer is positioned between the second barrier layer and one of the second plurality of metal pillars, and wherein each of the second contact layer, the second barrier layer, and the second strike layer have a diameter at least as large as the second diameter of the one of the second plurality of metal pillars.

7. The package of claim 6 further comprising:
a plurality of first solder layers, each of the plurality of first solder layers positioned between one of the first plurality of metal pillars and a corresponding second substrate pad; and
a plurality of second solder layers, each of the plurality of second solder layers positioned between one of the one of the second plurality of metal pillars and a corresponding second substrate pad,
wherein a diameter of each of the plurality of second solder layers is greater than a diameter of each of the plurality of first solder layers,
wherein a combined height of each of the a plurality of second solder layers and the corresponding one of the second plurality of metal pillars is substantially the same as a combined height of each of the plurality of first solder layers and the corresponding one of the first plurality of metal pillars.

8. The package of claim 7 wherein all of the metal pillars are electrically coupled to corresponding die substrate pads.

9. The package of claim 8 wherein each first and second barrier layer comprises titanium, and each first and second strike layer comprises copper.

10. The package of claim 8 wherein each die pad of the third plurality of die pads includes a third contact layer, a third barrier layer, and a third strike layer, wherein the third contact layer is positioned between the flip-chip device and the third barrier layer, wherein the third barrier layer is positioned between the third contact layer and the third strike layer, wherein the second strike layer is positioned between the third barrier layer and one of the third plurality of metal pillars, and wherein each of the third contact layer, the third barrier layer, and the third strike layer have a diameter at least as large as the third diameter of the one of the third plurality of metal pillars.

11. The package of claim 10 further comprising:
a plurality of third solder layers, each of the plurality of third solder layers positioned between one of the third plurality of metal pillars and a corresponding third substrate pad,
wherein a diameter of each of the plurality of third solder layers is greater than the first diameter of each of the plurality of first solder layers and the plurality of second solder layers,
wherein a combined height of each of the a plurality of third solder layers and the corresponding one of the third plurality of metal pillars is substantially the same as a combined height of each of the plurality of first solder layers and the corresponding one of the first plurality of metal pillars.

12. The package of claim 8, wherein each of the metal pillars of the first and second plurality of metal pillars has a height above a corresponding die pad and each of the plurality of first solder layers and the plurality of second solder layers has a height above the respective solder layer's metal pillar, and a ratio of the height of a metal pillar to the height of the respective metal pillar's solder layer is between 1:10 and 100:1, and the first diameter is at least 5% larger than the second diameter.

13. The package of claim 8, wherein the height of each of the metal pillars is 20 to 70 microns, the height of each solder layer is 10 to 60 microns, a sum of the height of each metal pillar and a respective solder layer is 80 microns or less, and the first and the second diameters are between 20 and 80 microns.

14. The package of claim 8, wherein a sum of the height of each of the metal pillars and a respective solder layer is between 5 microns and 130 microns and the first and second diameters are between 5 and 150 microns.

15. The package of claim 1, wherein the first plurality of metal pillars are positioned more toward a periphery of the package relative to the second plurality of metal pillars.

16. The package of claim 1, wherein at least one of the first plurality of metal pillars is a signal interconnection, and wherein at least one of the second plurality of metal pillars is a power interconnection or a ground interconnection.

17. The package of claim 1, wherein the flip-chip device comprises a material selected from the group consisting of silicon, gallium arsenide, indium phosphide, and a combination thereof and wherein the substrate is selected from the group consisting of glass-epoxy, polytetrafluoroethylene, ceramic, silicon, glass, and a combination thereof.

18. A package comprising:
a flip-chip device having die pads thereon;
a substrate having substrate pads thereon that are aligned with respective die pads;
a first plurality of metal pillars having a first diameter disposed between a first plurality of the die pads and a first plurality of the substrate pads;
a second plurality of metal pillars having a second diameter disposed between a second plurality of the die pads and a second plurality of the substrate pads; and
a third plurality of metal pillars having a third diameter disposed between a third plurality of the die pads and a third plurality of the substrate pads;
wherein the second diameter is greater than the first diameter, the third diameter is greater than the second diameter, all of the of metal pillars have substantially the same height, and the metal pillars are formed by plating metal onto the die pads.

19. A package comprising:
a flip-chip device having die pads thereon;
a substrate having substrate pads thereon that are aligned with respective die pads;
a first plurality of metal pillars having a first diameter disposed between a first plurality of the die pads and a first plurality of the substrate pads;
a second plurality of metal pillars having a second diameter disposed between a second plurality of the die pads and a second plurality of the substrate pads;
a third plurality of metal pillars having a third diameter disposed between a third plurality of the die pads and a third plurality of the substrate pads; and a fourth plurality of metal pillars having a fourth diameter disposed between a fourth plurality of the die pads and a fourth plurality of the substrate pads;

wherein the second diameter is greater than the first diameter, the third diameter is greater than the second diameter, the fourth diameter is greater than the third diameter, all of the of metal pillars have substantially the same height, and the metal pillars are formed by plating metal onto the die pads.

20. The package of claim 18 wherein each die pad of the first plurality of die pads includes at least one of a first contact layer, a first barrier layer, and a first strike layer.

21. The package of claim 20 wherein each die pad of the second plurality of die pads includes at least one of a contact layer, a barrier layer, and a strike layer.

22. The package of claim 18 wherein each die pad of the first plurality of die pads includes a first contact layer, a first barrier layer, and a first strike layer, wherein the first contact layer is positioned between the flip-chip device and the first barrier layer, wherein the first barrier layer is positioned between the first contact layer and the first strike layer, wherein the first strike layer is positioned between the first barrier layer and one of the first plurality of metal pillars, and wherein each of the first contact layer, the first barrier layer, and the first strike layer have a diameter at least as large as the first diameter of the one of the first plurality of metal pillars.

* * * * *